(12) United States Patent
Fujimoto et al.

(10) Patent No.: US 7,157,749 B2
(45) Date of Patent: Jan. 2, 2007

(54) BIPOLAR TRANSISTOR WITH A GAAS SUBSTRATE AND A SIGE BASE OR COLLECTOR

(75) Inventors: Hidetoshi Fujimoto, Kanagawa (JP); Tetsuro Nozu, Tokyo (JP); Yoshitomo Sagae, Kanagawa (JP); Akira Yoshioka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 130 days.

(21) Appl. No.: 11/053,548

(22) Filed: Feb. 9, 2005

(65) Prior Publication Data

US 2005/0189565 A1   Sep. 1, 2005

(30) Foreign Application Priority Data

Feb. 16, 2004   (JP)   ............... 2004-038933

(51) Int. Cl.
  *H01L 31/0328*   (2006.01)
  *H01L 31/0336*   (2006.01)
  *H01L 31/072*   (2006.01)
  *H01L 31/109*   (2006.01)

(52) U.S. Cl. .................................... 257/197
(58) Field of Classification Search ................ 257/197
  See application file for complete search history.

(56) References Cited

U.S. PATENT DOCUMENTS 5,304,816 A * 4/1994 Grinberg et al. ............... 257/26

FOREIGN PATENT DOCUMENTS

JP   2-150032   6/1990
JP   04-267529 *  9/1992

OTHER PUBLICATIONS

Masafumi Kawanaka, et al., "High-Gain Collector-Top Ge/GaAs Heterojunction Bipolar Transistors with a Base Layer Fabricated by Suppressing Ga Atom Diffusion at Ge/GaAs Heterojunctions", Japanese Journal of Applied Physics, vol. 30, No. 8, Aug. 1991, pp. 1659-1663.

* cited by examiner

*Primary Examiner*—Howard Weiss
(74) *Attorney, Agent, or Firm*—Oblon, Spivak, McClelland, Maier & Neustadt, P.C.

(57) ABSTRACT

A bipolar transistor is provided which includes a GaAs substrate, an n-type collector region formed on the GaAs substrate, a p-type base region formed on the n-type collector region and having a p-type base layer of SiGe having a composition lattice-matched with the GaAs substrate, and an n-type emitter region formed on the p-type base region. A bipolar transistor may include a GaAs substrate, a collector region of a first conductivity type formed on the GaAs substrate and including a collector contact layer of the first conductivity type SiGe, which has a composition lattice-matched with the GaAs substrate, a base region of a second conductivity type formed on the collector region of the first conductivity type, and an emitter region of the first conductivity type formed on the base region of the second conductivity type.

15 Claims, 4 Drawing Sheets

BIPOLAR TRANSISTOR WITH A GAAS SUBSTRATE AND A SIGE BASE OR COLLECTOR

CROSS-REFERENCE TO RELATED APPLICATION

This application is based upon and claims the benefit of priority from prior Japanese Patent Application No. 2004-38933, filed on Feb. 16, 2004, the entire contents of which are incorporated herein by reference.

BACKGROUND OF THE INVENTION

1. Field of the Invention

The present invention relates generally to a bipolar transistor and a method of manufacturing the same, and in particular to a bipolar transistor used for a high-frequency operation and a method of manufacturing the same.

2. Background Art

A transistor formed of GaAs, which is a III-V compound semiconductor, has characteristics such as high operating frequency, low noise, high output, high gain, low operating voltage, high operation efficiency, low power consumption, etc, which are superior to those of a silicon transistor. Because of such characteristics, GaAs field effect transistors (FETs) and heterojunction bipolar transistors (HBTs) have already been used as devices for mobile communication. In such GaAs transistors, HBTs are superior to FETs as amplifiers and oscillators since they have higher gain and higher breakdown voltage.

Recently, a new transistor, in which a GaAs HBT is combined with a material such as Ge, InGaAs, etc., has been proposed, as disclosed in the Japanese Journal of Applied Physics, 1991, Vol. 30, pp. 1,659–1,663.

Conventional GaAs HBTs have a problem in that operating voltages thereof are high.

It is obvious that a decrease in control voltage would result in a decrease in power consumption. As a method of decreasing control voltage, the use of a material having a lower band gap energy than GaAs as a material of a base layer has been proposed. However, no material has sufficiently solved the aforementioned problem.

Specifically, the aforementioned article (Japanese Journal of Applied Physics) discloses a transistor using Ge as a material of a base layer. The band gap of Ge (about 0.7 eV) is smaller than the band gap of GaAs (about 1.4 eV). In addition, the degree of lattice mismatching between Ge and GaAs is small. Accordingly, the aforementioned article proposes a transistor having a low control voltage, which is achieved by combining a GaAs HBT with a Ge base layer. However, Ge has a problem in that the degree of diffusion is great. Because of this diffusion problem, no GaAs HBT with a Ge base layer has actually been commercialized. Other transistors proposed use InGaAsN, GaAsSb, and InGaAs as a material for a base layer. However, although InGaAsN can be lattice-matched with a GaAs substrate, crystal-growth thereof is difficult to achieve, the etching thereof is difficult, and a theoretical ideal voltage decrease effect is only 0.25 eV. Furthermore, although GaAsSb has an advantage of forming a type-II heterojunction, the degree of lattice mismatching is great, and the crystal growth is difficult to achieve. Although InGaAs is commonly used for forming an emitter contact layer, it is difficult to use this for forming a base layer since the degree of lattice mismatching is great.

SUMMARY OF THE INVENTION

A bipolar transistor according to an embodiment of the present invention includes: a GaAs substrate; an n-type collector region formed on the GaAs substrate; a p-type base region formed on the n-type collector region and having a p-type base layer of SiGe having a composition lattice-matched with the GaAs substrate; and an n-type emitter region formed on the p-type base region.

A bipolar transistor according to an embodiment of the present invention includes: a GaAs substrate; a collector region of a first conductivity type formed on the GaAs substrate and including a collector contact layer of the first conductivity type SiGe, which has a composition lattice-matched with the GaAs substrate; a base region of a second conductivity type formed on the collector region of the first conductivity type; and an emitter region of the first conductivity type formed on the base region of the second conductivity type.

DESCRIPTION OF THE EMBODIMENTS

In the present invention, the terms "lattice-matching" or "lattice-matched" mean that the rate of lattice mismatching is 1% or less. When the rate of lattice-mismatching is 1% or less, it is possible to achieve good crystal growth by the MOCVD method, etc., which will be described later.

In Si devices, SiGe (silicon germanium) means a material obtained by adding a little germanium to silicon. However, in the present invention, the term "SiGe" also means a material obtained by adding a little silicon to germanium.

According to the embodiment of the present invention, it is possible decrease operating voltage of a GaAs HBT by using SiGe having a composition lattice-matched with a GaAs substrate as a material to form a base layer or collector contact layer.

Before describing the embodiments of the present invention, a GaAs HBT which the present inventors know will be described below.

Figure 5:
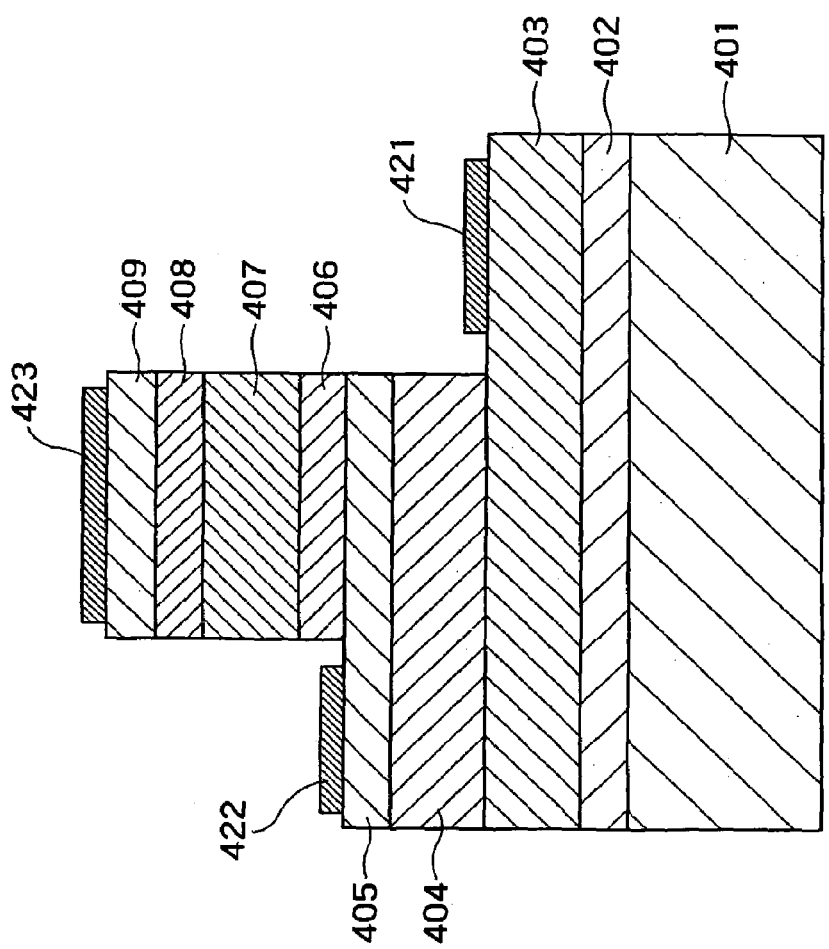
FIG. 5 is a sectional view showing a bipolar transistor which the present inventors know.

FIG. 5 shows the aforementioned GaAs HBT. A GaAs buffer layer 402, an n-type GaAs collector contact layer 403, an n-type GaAs collector layer 404, a p-type GaAs base layer 405, an n-type InGaP emitter layer 406, an n-type InGaP emitter resistance layer 407, an n-type GaAs layer 408, and an n-type InGaAs emitter contact layer 409 are sequentially formed on a semi-insulating SI-GaAs substrate 401. A collector electrode 421, a base electrode 422, and an emitter electrode 423 are respectively formed on the n-type GaAs collector contact layer 403, the p-type GaAs base layer 405, and the n-type InGaAs emitter contact layer 409.

The GaAs HBT shown in FIG. 5 has a structure established by combining the GaAs substrate 401 and the GaAs layers 402 to 405 and 408 with the InGaP layers 406 and 407, which are lattice-matched with the GaAs substrate 401 and the GaAs layers 402 to 405 and 408. A bipolar transistor, which is made by bonding semiconductor layers of more than two different kinds, each having a different band gap, and by using a semiconductor material having a wider band gap as an emitter material, is called a heterojunction bipolar transistor (HBT). In the illustrated HBT, an InGaAs layer, which has a narrower energy gap, is used to form the uppermost emitter contact layer 409, thereby decreasing the contact resistance thereof. Thus, in a GaAs HBT, it is possible to obtain a good characteristic by combining such semiconductors as GaAs, InGaP, and InGaAs, each having a different band gap.

An amplifying circuit using a GaAs HBT generally has an emitter-follower structure, which requires a control voltage of more than two times the base-emitter voltage $V_{BE}$. The base-emitter voltage $V_{BE}$ is greatly dependent on the band gap energy of the base layer material. However, when the base layer 405 is formed of GaAs, as in the case of the HBT of FIG. 5, the band gap energy of GaAs becomes greater than that of Si, and the base-emitter voltage $V_{BE}$ becomes about 1.2–1.3 V. Accordingly, a control voltage of about 2.8 V is required, thereby increasing the operating voltage.

Thus, the aforementioned GaAs HBT could not have achieved good characteristics when GaAs was used to form a base layer. Accordingly, the aforementioned GaAs HBT shown in FIG. 5 has used GaAs as a material to form the base layer 405. The control voltage of such a transistor becomes high.

Furthermore, as shown in FIG. 5, a conventional GaAs HBT uses GaAs to form the collector contact layer 403 as well as the base layer 405. This leads to a high collector voltage.

Thus, in the aforementioned GaAs HBT, operating voltages, such as base-emitter voltage $V_{BE}$, control voltage, collector voltage, etc., are high.

The present invention is proposed in view of such circumstances.

Figure 1:
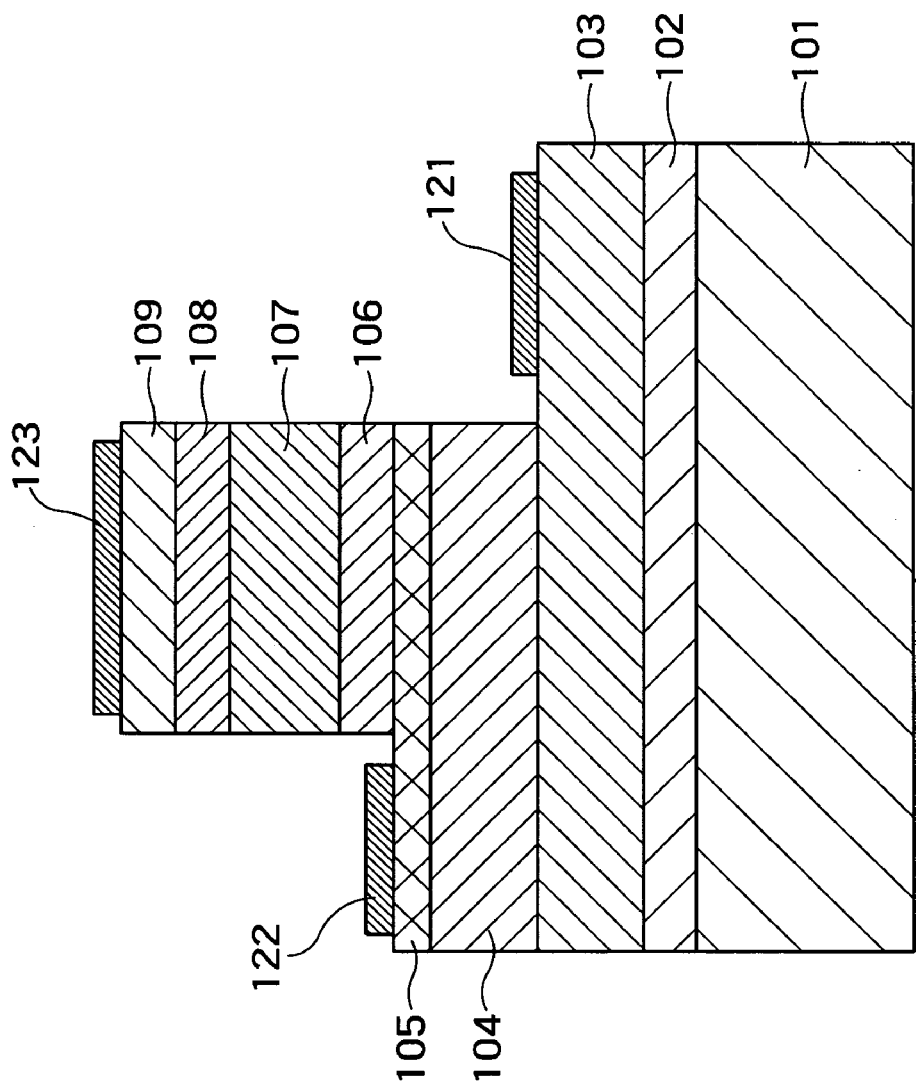
FIG. 1 is a sectional view showing a bipolar transistor according to a first embodiment of the present invention.
Figure 4:
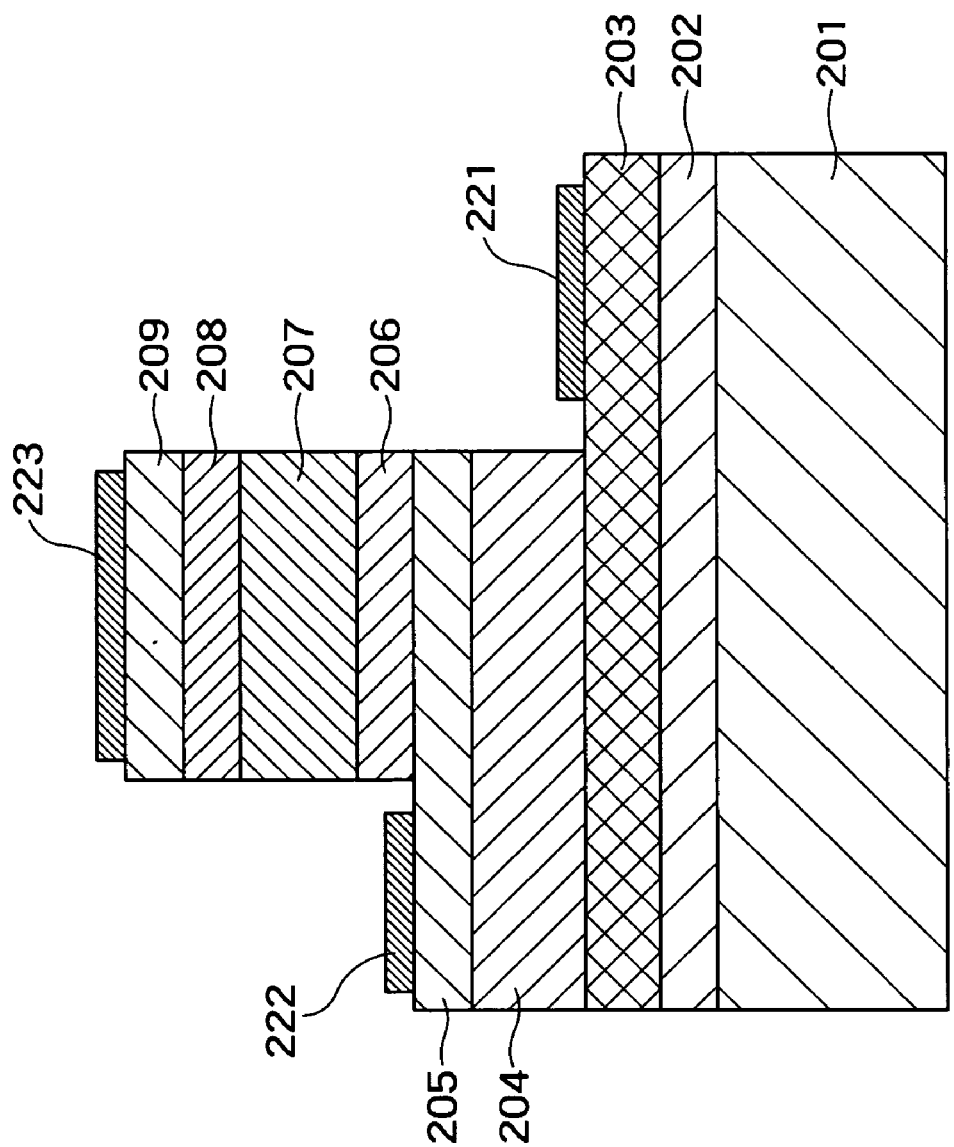
FIG. 4 is a sectional view showing a bipolar transistor according to a second embodiment of the present invention.

Hereinafter, embodiments of the present invention will be described with reference to the accompanying drawings. One of the remarkable features of the embodiments lies in that SiGe (with an Si content of 2.2%) is used to form a base layer 105 of a GaAs HBT, as shown in FIG. 1. Another remarkable feature lies in that SiGe (with an Si content of 2.2%) is used to form a collector contact layer 203 of a GaAs HBT, as shown in FIG. 4. With such features, it is possible to decrease the operating voltage. Now, a first embodiment using SiGe to form the base layer 105 and a second embodiment using SiGe to from the collector contact layer 203 will be described.

(First Embodiment)

FIG. 1 is a sectional view showing a bipolar transistor according to the first embodiment of the present invention. The bipolar transistor includes a GaAs buffer layer 102, an n-type GaAs collector contact layer 103, an n-type GaAs collector layer 104, a p-type SiGe base layer 105 (with an Si content of 2.2%), an n-type InGaP emitter layer 106, an n-type InGap emitter resistance layer 107, an n-type GaAs layer 108, and n-type InGaAs emitter contact layer 109, all being formed on a semi-insulating SI-GaAs substrate 101. A collector electrode 121, a base electrode 122, and an emitter electrode 123 are respectively formed on the n-type GaAs collector contact layer 103, the p-type GaAs base layer 105, and the n-type InGaAs emitter contact layer 109.

Among the aforementioned layers, the n-type GaAs collector contact layer 103 and the n-type GaAs collector layer 104 can be regarded as an n-type collector region. Furthermore, the p-type SiGe base layer can be regarded as a p-type base region. Moreover, the n-type InGaP emitter layer 106 to the InGaAs emitter contact layer 109 can be regarded as an n-type emitter region. The n-type collector regions 103 and 104, the p-type base region 105, and the layers 106 to 108 of the n-type emitter region are formed of materials that can be lattice-matched with the GaAs substrate 101. The terms "lattice-matching" or "lattice-matched" used herein mean that the rate of lattice mismatching is 1% or less. When the rate of lattice-mismatching is 1% or less, it is possible to achieve good crystal growth by the MOCVD method, etc., which will be described later.

One of the characteristic features of the transistor as shown in FIG. 1 is the use of SiGe as a material for forming the base layer 105. Compared with the conventional GaAs base layer 405 (FIG. 5), the SiGe base layer 105 is thinner, as shown in FIG. 1. The reason for such a decrease in thickness is the specific resistance of SiGe being smaller than that of GaAs.

The transistor shown in FIG. 1 is an npn junction bipolar transistor including the n-type collector regions 103 and 104, the p-type base region 105, and the n-type emitter region 106 to 109. This bipolar transistor uses a plurality of semiconductor materials such as GaAs, SiGe, and InGap, each having a different band gap. The band gap of the emitter layer 106 is greater than that of the base layer 105. Such a bipolar transistor is called "heterojunction bipolar transistor (HBT)." This HBT is a GaAs HBT using the GaAs substrate 101. Furthermore, this HBT is used by applying a voltage to the collector electrode 121, the base electrode 122, and the emitter electrode 123, as in the case of a conventional npn junction GaAs HBT.

Next, a method of manufacturing the GaAs HBT shown in FIG. 1 will be described below.

First, a semi-insulating GaAs substrate 101 is mounted on a susceptor, which is heatable and located within an MOCVD apparatus. Thereafter, the substrate 101 is heated until the temperature thereof reaches about 650° C., and then left under an $AsH_3$ gas atmosphere for about 10 minutes so as to remove a natural oxide film formed on the surface thereof.

Subsequently, TMG (trimethylgallium) is added to the $GaH_3$ gas using hydrogen gas as a carrier gas, thereby growing the GaAs buffer layer 102.

Then, $SiH_4$ gas is further added to the aforementioned materials, thereby growing the n-type GaAs collector contact layer 103 and the n-type GaAs collector layer 104. The carrier concentrations of the two layers 103 and 104 differ from each other. The carrier concentrations can be adjusted by changing the supply rate of $SiH_4$ gas, or by preparing two $SiH_4$ gas containers each including SiH4 gas with a different concentration and by switching the gas supply from these two gas containers with the supply amount being kept constant.

Next, the temperature of the substrate 101 is lowered to be 450° C. under an $AsH_3$ atmosphere, and $SiH_4$, $GeH_4$, and TMG are supplied at this temperature, thereby growing the p-type SiGe base layer 105. At this time, attention should be given to the fact that the height of barrier at the interface varies depending on the growth temperature. Specifically, in terms of the band lineup in the conduction band, when the growth temperature is high, the SiGe layer 105 serves as a well for the GaAs layer 104, and when the growth temperature is low, the SiGe layer 105 serves as a barrier for the GaAs layer 104. In this embodiment, since an advantageous HBT can be obtained when a type II heterojunction interface is formed, in which inverse hole injection is less likely to occur, the base layer 105 is grown at a low temperature. Furthermore, as will be described later, since it is possible to perform a high-concentration doping of the p-type SiGe base layer 105, it is possible to decrease the thickness of the layer.

Thereafter, the temperature of the substrate 101 is increased to be 600° C. under an AsH$_3$ gas atmosphere, and at this temperature, TMG, TMI (trimethylindium), PH$_3$ gas and SiH$_4$ gas are added to grow the n-type InGaP layers 106 and 107.

Then, the source gases to be supplied are changed to TMG, AsH$_3$ gas, and SiH$_4$ gas, thereby growing the n-type GaAs layer 108.

Next, the temperature of the substrate 101 is lowered to be 450° C. under an AsH$_3$ gas atmosphere, and the n-type InGaAs emitter contact layer 109 is grown with the source gasses such as TEG (triethylgallium), TMI, AsH$_3$ gas, and DETe (diethyltellurium) being supplied. Since the layer 109 is not lattice-matched with the GaAs layer 108 and the InGaP layers 106 and 107, it is preferable that a graded junction part (an InGaAs layer in which the In content is continuously changed) be provided.

Thereafter, the grown wafer is taken out of the apparatus for growth. Then selecting etching of the InGaAs layer 109 and the GaAs layers 108 and 104 with a mixed solution of phosphoric acid, oxygenated water, and pure water, of the InGaP layers 106 and 107 with hydrochloric acid, and of the SiGe layer 105 with a mixed acid containing oxygenated water, is performed, thereby exposing the base layer 105 and the collector contact layer 103. Then, ohmic electrodes 121 to 123 are appropriately formed using the lift-off process. The materials for forming the electrodes are, for example, a laminated structure of Au/Ge/Ni for the collector electrode 121 and the emitter electrode 123, and an Au—Ge alloy for the base electrode 122.

Then, the aforementioned device structure is separated/divided, located on a separately prepared AlN mount support substrate, combined/coupled with other devices, and subjected to a process such as molding, thereby completing the transistor as shown in FIG. 1.

One of the characteristic features of the GaAs HBT of FIG. 1 manufactured by the aforementioned method is the use of SiGe (with an Si content of 2.2%) for the base layer 105. The band gap of SiGe is about 0.7 eV, which is smaller than the band gap of GaAs (about 1.4 eV) and the band gap of Si (about 1.1 eV). Furthermore, with Ge, it is possible to increase the p-type carrier concentration to a very high level. Accordingly, it is possible to decrease the operating voltage of the transistor shown in FIG. 1. Specifically, it is possible to decrease the base—emitter voltage $V_{BE}$ to about 0.6–0.7 V, although the value may vary depending on the value of the operating current. As a result, in a circuit having an emitter—follower structure, it is possible to decrease the control voltage to about less than 2 V.

Furthermore, unlike InGaAsN and GaAsSb, in SiGe, hydrogen does not cause the deactivation of an acceptor impurity. Accordingly, no extra heat treatment is required when SiGe is used. In addition, no device degradation is caused.

Conventionally, those skilled in the art have not used a SiGe base layer 105 in a GaAs HBT. The reason for this is that no preferable device characteristic could be obtained from the Ge layer of a GaAs HBT due to the diffusion of Ge, and that according to the diffusion theory, Ge diffusion could not be decreased even if a few percent of Si is added to Ge. However, the present inventors have noticed from experiments that in a GaAs HBT, the diffusion of Ge can be dramatically curbed when a small amount of Si is added to a Ge layer. This will be explained with reference to FIG. 2.

Figure 2:
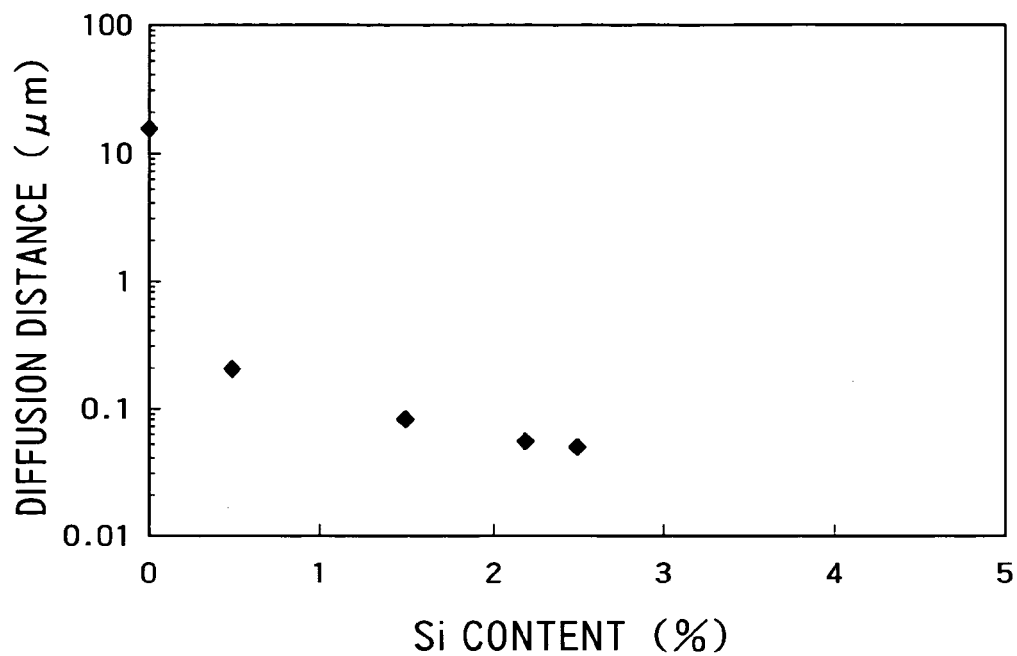
FIG. 2 shows the relationship between the Si content of a p-type SiGe base layer 105 and the diffusion distance of Ge from the p-type SiGe base layer 105 in the bipolar transistor according to the first embodiment of the present invention.

FIG. 2 shows the Ge diffusion distance from the base layer 105 toward the GaAs collector layer 104 of a transistor having the same structure as the transistor of FIG. 1 when the Si content of the base layer 105 formed of a p-type SiGe or Ge is changed. The horizontal axis represents the Si content (%) of the base layer 105, and the vertical axis represents the Ge diffusion distance (μm). As shown in FIG. 2, when the base layer 105 is formed of Ge (with the Si content of 0%), the diffusion distance is 10 μm or more. In this case, the device characteristics degrade due to the diffusion of Ge. However, when a small amount (about 0.5%) of silicon is added to the base layer 105, the diffusion can be dramatically curbed to about one tenth. As the amount of silicon is increased to about 2.5%, the diffusion is further decreased. Such a sharp decrease in diffusion cannot be explained in accordance with only the conventional diffusion theory. The present inventors consider the reason for such a sharp decrease in diffusion to be as follows.

That is to say, the base layer 105 of SiGe made by adding a small amount (more than 0% and less than about 2.5%) of Si to Ge has a lattice constant which is closer to that of the GaAs substrate 101 and the GaAs collector layer 104 than that of a base layer formed of Ge. With such close lattice constants, the degree of crystal defects and transition within the base layer 105 and the collector layer 104 can be decreased, thereby decreasing the Ge diffusion from the base layer 105 toward the collector layer 104. Furthermore, it is deemed that in a material obtained by adding a small amount of Si to Ge, it is hard to generate crystal defects or transition for an unknown reason. The present inventors believe that the addition of a small amount of Si causes a sharp decrease in Ge diffusion from the base layer 105 toward the collector layer 104 for the aforementioned reasons.

Thus, since the degradation of device characteristics due to the Ge diffusion seldom occurs in the transistor of FIG. 1, it is possible to obtain preferable characteristics (FIG. 2).

Furthermore, with the transistor shown in FIG. 1, it is possible to considerably improve the hole mobility, thereby obtaining a superior high-frequency characteristic. This will be explained below with reference to FIG. 3.

Figure 3:
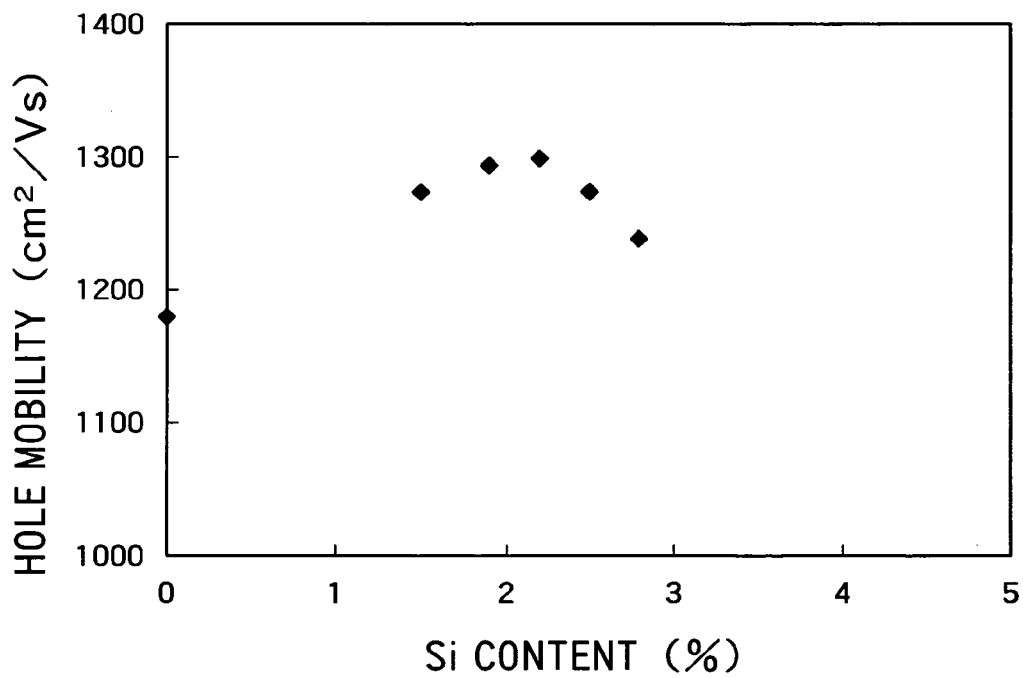
FIG. 3 shows the relationship between the Si content and the hole mobility of the p-type SiGe base layer 105 in the bipolar transistor according to the first embodiment of the present invention.

FIG. 3 shows the hole mobility of the base layer 105 of a p-type SiGe or Ge in a transistor having the same structure as the transistor of FIG. 1, when the Si content of the base layer 105 is changed. The horizontal axis represents the Si content (%) of the base layer 105, and the vertical axis represents the hole mobility (cm$^2$/Vs) . The measurement temperature is 300K. For the purpose of reference, the hole mobility of the materials used to form the transistor of FIG. 1 at a temperature of 300K is: 480 cm$^2$/Vs for Si; 1,500 cm$^2$/Vs for Ge; and 420 cm$^2$/Vs for GaAs.

As shown in FIG. 3, in the case where the base layer 105 is formed of Ge (with an Si content of 0%), the hole mobility is 1,180 cm$^2$/Vs . As the Si content is increased and becomes closer to 2.2%, the hole mobility is increased. When the Si content is 2.2%, the hole mobility shows the maximum value, i.e., about 1,300 cm$^2$/Vs. Thereafter, the higher the Si content becomes, the lower value the hole mobility shows.

The result shown in FIG. 3 contradicts the conventionally held technical common sense, according to which the hole mobility of the base layer 105 formed of SiGe should be less than that of the base layer 105 formed of Ge. According to the experiment conducted by the present inventors, however, a high hole mobility was achieved when 2.2% of Si was added to Ge of the base layer 105 in a GaAs HBT. The present inventors believe that the reason for this is that when the Si content of SiGe is 2.2%, the lattice constants of SiGe and GaAS becomes substantially identical, thereby considerably curbing the transition and crystal defect of the base layer 105 formed of SiGe.

Thus, in the transistor of FIG. 1, it is possible to considerably improve the mobility in the base layer 105 (FIG. 3). Accordingly, the transistor of FIG. 1 is superior in high-frequency characteristic.

Furthermore, in the transistor of FIG. 1, it is possible to perform a high-concentration doping of the base layer 105, thereby decreasing the thickness thereof. As a result, a higher speed of the transistor can be achieved, thereby obtaining more superior high-frequency characteristic.

In the aforementioned GaAs HBT shown in FIG. 1, the Si content of the p-type SiGe base layer 105 is 2.2%. However, the Si content of the SiGe base layer 105 can be a value (excluding zero) that enables the lattice-matching with the GaAs substrate 101. Preferably, the Si content is 2% or more and 2.5% or less, and more preferably, 2.2%. When the base layer 105 and the GaAs substrate 101 are lattice matched (when the degree of lattice-mismatching is 1% or less), it is possible to achieve the crystal growth by a typical crystal growth method, such as the MOCVD method. Furthermore, when the Si content is 2% or more and 2.5% or less, the degree of Ge diffusion can be decreased (FIG. 2), and the degree of hole mobility in the base layer 105 can be improved (FIG. 3). When the Si content is 2.2%, it is possible to considerably improve the hole mobility, thereby achieving a superior high-frequency characteristic.

Moreover, in the GaAs HBT of FIG. 1, it is possible to use the molecular beam epitaxy (MBE) method as the crystal growth method instead of the MOCVD method.

(Second Embodiment)

One of the characteristic features of the GaAs HBT of the second embodiment is the use of SiGe to form the collector contact layer 203, as shown in FIG. 4.

FIG. 4 is a sectional view showing a bipolar transistor according to the second embodiment of the present invention. This bipolar transistor includes a GaAs buffer layer 202, an n-type SiGe collector contact layer 203 (with the Si content of 2.2%), a collector contact layer 203, an n-type GaAs collector layer 204, a p-type GaAS base layer 205, an n-type InGaP emitter layer 206, an n-type InGaP emitter resistance layer 207, an n-type GaAs layer 208, and an n-type InGaAs emitter contact layer 209, which are formed on a semi-insulating SI-GaAs substrate 201. A collector electrode 221, a base electrode 222, and an emitter electrode 223 are respectively formed on the n-type SiGe collector contact layer 203, the p-type GaAs base layer 205, and the n-type InGaAs emitter contact layer 209.

Among the aforementioned layers, the n-type GaAS collector contact layer 203 and the n-type SiGe collector layer 204 can be regarded as an n-type collector region, the p-type GaAs base layer can be regarded as a p-type base region, and the n-type InGaP emitter layer 106 to the n-type InGaAS emitter contact layer 109 can be regarded as an n-type emitter region. The n-type collector region 203 to 204, the p-type base region 205, and the n-type emitter region 206 to 209 are formed of materials which are lattice-matched with the GaAs substrate 201.

One of the characteristic features of the transistor of FIG. 4 is the use of SiGe as a material for forming the collector contact layer 203. As shown in FIG. 4, the SiGe collector contact layer 203 is thinner than a conventional GaAs collector contact layer 403 (FIG. 5). Specifically, the thickness of the SiGe collector contact layer 203 of FIG. 4 is 200 nm or less, while the thickness of the conventional GaAs collector contact layer 403 (FIG. 5) is about 500 nm. The reason for such a decrease in thickness is the resistance of SiGe which is smaller than the resistance of GaAs.

Next, a method of manufacturing the GaAs HBT shown in FIG. 4 will be described below.

First, a semi-insulating GaAs substrate 201 is mounted on a heatable susceptor located within an MOCVD apparatus. The substrate 201 is then heated to a temperature of about 650° C., and left under an $AsH_3$ gas atmosphere for about 10 minutes so as to remove a natural oxide film formed on the surface thereof.

Subsequently, TMG (trimethylgallium) is added to the $AsH_3$ gas using hydrogen gas as a carrier gas, thereby growing a GaAs buffer layer 202.

Then, $SiH_4$ gas, $GeH_4$ gas, and $AsH_3$ gas are supplied, thereby growing an n-type SiGe collector contact layer 203.

Thereafter, $AsH_3$ gas, TMG, and $SiH_4$ gas are supplied, thereby forming an n-type GaAs collector layer 204.

Subsequently, the temperature of the substrate 201 is decreased to 520° C. under an $AsH_3$ gas atmosphere. Then, AsH3 gas and TMG are supplied at a low flow rate, thereby growing a p-type GaAs base layer 205. In this case, it is possible to supply a carbon containing material such as $CBr_4$ so as to grow the layer 205.

Then, the temperature of the substrate 201 is increased to 600° C. under an $AsH_3$ gas atmosphere. Thereafter, at that temperature, n-type InGaP layers 206 and 207 are grown using TMG, TMI (trimethylindium), $PH_3$ gas, and $SiH_4$ gas. The carrier concentrations of the layers 206 and 207 differ from each other. The carrier concentrations can be adjusted by changing the supply rate of $SiH_4$ gas, or by preparing two $SiH_4$ gas containers each including $SiH_4$ gas with a different concentration and by switching the gas supply from these two gas containers with the supply amount being kept constant.

Then, the source gas to be supplied is changed to TMG, $AsH_3$ gas, and $SiH_4$ gas, thereby growing an n-type GaAs layer 208.

Next, the temperature of the substrate 201 is lowered to be 450° C. under an $AsH_3$ gas atmosphere, and an n-type InGaAs emitter contact layer 209 is grown with the source gasses such as TEG (triethylgallium), TMI, $AsH_3$ gas, and DETe (diethyltellurium) being supplied.

Thereafter, the grown wafer is taken out of the apparatus for growth. Then, selecting etching of the InGaAs layer 209 and the GaAs layers 208, 205 and 204 is performed with a mixed solution of phosphoric acid, oxygenated water, and pure water. Also, etching of the InGaP layers 206 and 207 with hydrochloric acid is performed, thereby exposing the base layer 205 and the collector contact layer 203. Since the collector contact layer 203 is formed of a dissimilar material, i.e., SiGe, the over-etching of the collector contact layer 203 can be prevented. Then, ohmic electrodes 221 to 223 are formed using the lift-off process. The metal materials for forming the electrodes are, for example, a laminated structure of Au/Ge/Ni for the collector electrode 221 and the emitter electrode 223, and an Au—Ge alloy for the base electrode 222.

Then, the aforementioned device structure is separated/divided, located on a separately prepared AlN mount support substrate, combined/coupled with other devices, and subjected to a process such as molding, thereby completing the transistor as shown in FIG. 4.

The GaAs HBT of FIG. 4 manufactured by the aforementioned method uses SiGe (with the Si content of 2.2%) to form the collector contact layer 203. As mentioned before, the band gap of SiGe is considerably smaller than that of GaAs. Furthermore, it is possible to considerably increase the carrier concentration of SiGe, as compared with GaAs. By using such a layer with a high carrier concentration and a low energy gap as the collector contact layer 203, it is possible to decrease the operating voltage.

Furthermore, since the GaAs HBT of FIG. 4 uses a layer with a high carrier concentration and a low energy gap as the collector contact layer 203, it is possible to decrease the thickness of the collector contact layer 203.

Moreover, in the GaAs HBT of FIG. 4, it is possible to decrease the electrode contact resistance in the collector contact layer 203 at the time of supplying a high electric power. Accordingly, it is possible to curb the generation of heat at the electrode contact portion. Thus, it is possible to achieve a stable operation without causing thermal runaway. Furthermore, it is possible to elongate the life of devices.

At the time of isolating devices during the process of manufacturing the GaAs HBT, it is possible to decrease the mesa etching thickness, as well as the dose amount and the acceleration voltage at the time of ion implantation. Accordingly, it is possible to decrease the degree of damage to the entire device, thereby improving the yield of the device manufacturing process.

Furthermore, as in the case of the first embodiment (FIG. 1), in the GaAs HBT of FIG. 4, the characteristics of the transistor are hardly degraded due to the Ge diffusion from the n-type SiGe collector contact layer 203 (FIG. 2).

In the aforementioned GaAs HBT of FIG. 4, the composition of the n-type SiGe collector contact layer 203 can be any composition as long as the GaAs HBT is lattice-matched with the GaAs substrate 101 (excluding the case where the Si content is zero).

In addition, in the GaAs HBT of FIG. 4, it is possible to reverse the n-type and the p-type.

The invention is:

1. A bipolar transistor comprising:
   a GaAs substrate;
   an n-type collector region formed above the GaAs substrate;
   a p-type base region formed on the n-type collector region and having a p-type base layer of SiGe having a composition lattice-matched with the GaAs substrate; and
   an n-type emitter region formed on the p-type base region.

2. The bipolar transistor according to claim 1, wherein a Si content of SiGe in the p-type base layer is 2.0% or more and 2.5% or less.

3. The bipolar transistor according to claim 2, wherein the Si content of SiGe is 2.2%.

4. The bipolar transistor according to claim 1, wherein the p-type base region is doped.

5. The bipolar transistor according to claim 1, wherein the p-type base region is Ga doped.

6. The bipolar transistor according to claim 1, wherein the n-type collector region and the p-type base region are formed of a material lattice-matched with the GaAs substrate, and the n-type emitter region includes a layer of a material lattice-matched with the GaAs substrate provided at a side of the GaAs substrate.

7. The bipolar transistor according to claim 1, wherein the n-type collector region and the p-type base region are formed of a material having a lattice-mismatching rate of 1% or less with respect to the GaAs substrate, and the n-type emitter region includes a layer of a material having a lattice-mismatching rate of 1% or less provided at a side of the GaAs substrate.

8. The bipolar transistor according to claim 1, wherein the n-type collector region includes two layers each having a different carrier concentration.

9. The bipolar transistor according to claim 1, wherein the n-type emitter region includes a first region located at a side of the GaAs substrate, and a second region located at a side opposite to the GaAs substrate, and the second region includes a graded junction portion in which an impurity content is continuously varied.

10. A bipolar transistor comprising:
    a GaAs substrate;
    a collector region of a first conductivity type formed above the GaAs substrate and including a collector contact layer of the first conductivity type SiGe, which has a composition lattice-matched with the GaAs substrate;
    a base region of a second conductivity type formed on the collector region of the first conductivity type; and
    an emitter region of the first conductivity type formed on the base region of the second conductivity type.

11. The bipolar transistor according to claim 10, wherein the collector region is n-type doped.

12. The bipolar transistor according to claim 10, wherein the collector region is As doped n-type.

13. The bipolar transistor according to claim 10, further comprising a collector electrode formed to contact the collector contact layer of the collector region.

14. The bipolar transistor according to claim 10, wherein the collector contact layer has a composition lattice-matched with the GaAs substrate.

15. The bipolar transistor according to claim 10, wherein the first conductivity type is n-type or p-type, and the second conductivity type is p-type or n-type.

* * * * *